(12) United States Patent
Knape et al.

(10) Patent No.: US 11,024,893 B2
(45) Date of Patent: Jun. 1, 2021

(54) BATTERY OF MODULAR CONSTRUCTION HAVING IMPROVED SAFETY PROPERTIES

(71) Applicant: VW-VM Forschungsgesellschaft mbH & Co., KG, Ellwangen Jagst (DE)

(72) Inventors: Torsten Knape, Isenbüttel (DE); Werner Schreiber, Meine (DE)

(73) Assignees: VARTA Microbattery GmbH, Ellwangen Jagst (DE); VW Kraftwerk GmbH, Wolfsburg (DE)

( * ) Notice: Subject to any disclaimer, the term of this patent is extended or adjusted under 35 U.S.C. 154(b) by 228 days.

(21) Appl. No.: 15/949,447

(22) Filed: Apr. 10, 2018

(65) Prior Publication Data

US 2018/0301765 A1  Oct. 18, 2018

(30) Foreign Application Priority Data

Apr. 12, 2017  (DE) .................... 10 2017 206 358.0

(51) Int. Cl.
| | |
|---|---|
| H01M 10/42 | (2006.01) |
| H01M 10/04 | (2006.01) |
| H01M 10/48 | (2006.01) |
| H01M 50/20 | (2021.01) |
| G01R 31/36 | (2020.01) |
| G01R 31/396 | (2019.01) |

(52) U.S. Cl.
CPC .... *H01M 10/4257* (2013.01); *G01R 31/3644* (2013.01); *G01R 31/396* (2019.01); *H01M 10/0468* (2013.01); *H01M 10/0481* (2013.01); *H01M 10/425* (2013.01); *H01M 10/48* (2013.01); *H01M 10/482* (2013.01); *H01M 10/486* (2013.01); *H01M 50/20* (2021.01); *H01M 2010/4271* (2013.01); *H01M 2200/10* (2013.01); *H01M 2200/20* (2013.01); *H01M 2220/20* (2013.01)

(58) Field of Classification Search
None
See application file for complete search history.

(56) References Cited

U.S. PATENT DOCUMENTS

| | | | |
|---|---|---|---|
| 2,812,376 | A | 11/1957 | Yardney |
| 7,511,456 | B2 | 3/2009 | Lee et al. |
| 2013/0136963 | A1 | 5/2013 | Chiba |
| 2015/0295208 | A1 | 10/2015 | Schumann et al. |

FOREIGN PATENT DOCUMENTS

| | | |
|---|---|---|
| DE | 10 2009 035482 A1 | 2/2011 |
| DE | 10 2014 206813 A1 | 10/2015 |
| EP | 2 094 523 A1 | 9/2009 |
| JP | 9-284901 | * 10/1997 |
| JP | 2010-205479 A | 9/2010 |

* cited by examiner

*Primary Examiner* — Jonathan Crepeau
(74) *Attorney, Agent, or Firm* — DLA Piper LLP (US)

(57) ABSTRACT

A battery of modular construction that stores electrical energy includes a battery housing, a module assembly including at least two battery modules, each with at least one positive and at least one negative electrode, and a pressing means. A method of safety operation of the battery includes equipping the battery with at least one safety means that triggers a reduction in the mechanical pressure exerted onto the battery modules when there is a defect in at least one of the battery modules.

11 Claims, 4 Drawing Sheets

BATTERY OF MODULAR CONSTRUCTION HAVING IMPROVED SAFETY PROPERTIES

TECHNICAL FIELD

This disclosure relates to a battery of modular construction for storing electrical energy, comprising a battery housing in which a module assembly comprising at least two battery modules, each with at least one positive and at least one negative electrode, is arranged, and also to a method for safe operation of a battery.

BACKGROUND

Modular systems comprising a plurality of battery modules connected in series and each having a positive and a negative electrode are usually used as batteries in electric and hybrid vehicles. The battery modules generally each have a module housing with two external connection poles. One of the connection poles is coupled to the at least one positive electrode, the other to the at least one negative electrode. The battery modules are generally connected in series by the connection poles.

The battery modules are generally arranged next to one another in a module assembly. They are usually fixedly pressed against one another by a tensioning element, for example, a tensioning belt. The module assembly is, for its part, arranged in a battery housing. The mechanical forces produced within the assembly during charging and discharging are generally absorbed by the battery housing. To this end, the battery modules are often arranged in the battery housing in an interlocking manner.

An internal short circuit can arise in the battery module in the event of damage to the battery module within the module assembly. This may lead to development of a high level of heat, electrolyte decomposition and accompanying formation of gas within the battery module. On account of the direct contact between the damaged battery module and the respectively adjacent battery modules, the heat produced in the defective battery module can be transmitted to the adjacent battery modules over large contact areas. This leads to an increase in temperature in the adjacent battery modules.

The increase in temperature in the adjacent battery modules very often leads to chemical reactions being set into motion in the adjacent battery modules. Electrolyte decomposition and uncontrolled heating may likewise occur in the adjacent battery modules as a result. This chain reaction (often also called propagation) can lead to complete destruction of the entire module assembly and, as a result, destruction of other components located in the vicinity of the assembly.

It could therefore be helpful to provide a battery of modular construction having a suitable safety means for the purpose of avoiding the described chain reaction or propagation.

SUMMARY

We provide a battery of modular construction that stores electrical energy including 1) a battery housing; 2) a module assembly including at least two battery modules, each with at least one positive and at least one negative electrode; 3) a pressing means, wherein the battery housing surrounds an interior in which the module assembly is arranged, and the module assembly does not completely fill the interior so that a dead volume remains; the at least two battery modules electrically connect to one another; the at least two battery modules are arranged next to one another in the module assembly; optionally, a respective spacer element is arranged between adjacent battery modules in the module assembly; and the pressing means exerts a mechanical pressure onto the battery modules in the module assembly, the mechanical pressure pressing adjacent battery modules of the module assembly against one another or against the spacer element which may be arranged between them; 4) a force-measuring device with which a force directed against the mechanical pressure exerted by the pressing means can be detected, and/or a temperature-measuring device that can detect a temperature in the battery housing and/or a temperature of individual battery modules of the module assembly, and/or a voltage-measuring device that can detect a change in a voltage, output by a module assembly as a result of a defect in at least one of the battery modules of the module assembly, and/or a current-measuring device that can detect a change in the current output by the module assembly as a result of a defect in at least one of the battery modules of the module assembly, wherein the device or the devices is or are coupled to a data-processing device to which measurement results from the device or from the devices are transmitted, the battery has at least one safety means in the interior of the battery housing, the safety means triggering a reduction in the mechanical pressure exerted onto the battery modules when there is a defect in at least one of the battery modules, the safety means is or includes a means for displaying and/or deactivating the pressing means, the means destroying or deactivating the pressing means in the presence of a defect, and destroying and/or deactivation means is coupled to the data-processing device and initiates destruction or deactivation of the pressing means in response to a signal from the data-processing device.

We also provide a method of safety operation of the battery of modular construction that stores electrical energy including 1) a battery housing; 2) a module assembly including at least two battery modules, each with at least one positive and at least one negative electrode; 3) a pressing means, wherein the battery housing surrounds an interior in which the module assembly is arranged, and the module assembly does not completely fill the interior so that a dead volume remains; the at least two battery modules electrically connect to one another; the at least two battery modules are arranged next to one another in the module assembly; optionally, a respective spacer element is arranged between adjacent battery modules in the module assembly; and the pressing means exerts a mechanical pressure onto the battery modules in the module assembly, the mechanical pressure pressing adjacent battery modules of the module assembly against one another or against the spacer element which may be arranged between them; 4) a force-measuring device with which a force directed against the mechanical pressure exerted by the pressing means can be detected, and/or a temperature-measuring device that can detect a temperature in the battery housing and/or a temperature of individual battery modules of the module assembly, and/or a voltage-measuring device that can detect a change in a voltage, output by a module assembly as a result of a defect in at least one of the battery modules of the module assembly, and/or a current-measuring device that can detect a change in the current output by the module assembly as a result of a defect in at least one of the battery modules of the module assembly, wherein the device or the devices is or are coupled to a data-processing device to which measurement results from the device or from the devices are transmitted, the battery has at least one safety means in the interior of the battery housing, the safety means triggering a reduction in the mechanical pressure exerted onto the battery modules when there is a defect in at least one of the battery modules, the safety means is or includes a means for displaying and/or deactivating the pressing means, the means destroying or deactivating the pressing means in the presence of a defect, and destroying and/or deactivation means is coupled to the data-processing device and initiates destruction or deactivation of the pressing means in response to a signal from the data-processing device, including equipping the battery with at least one safety means that triggers a reduction in the mechanical pressure exerted onto the battery modules when there is a defect in at least one of the battery modules.

DETAILED DESCRIPTION

Figure 1:
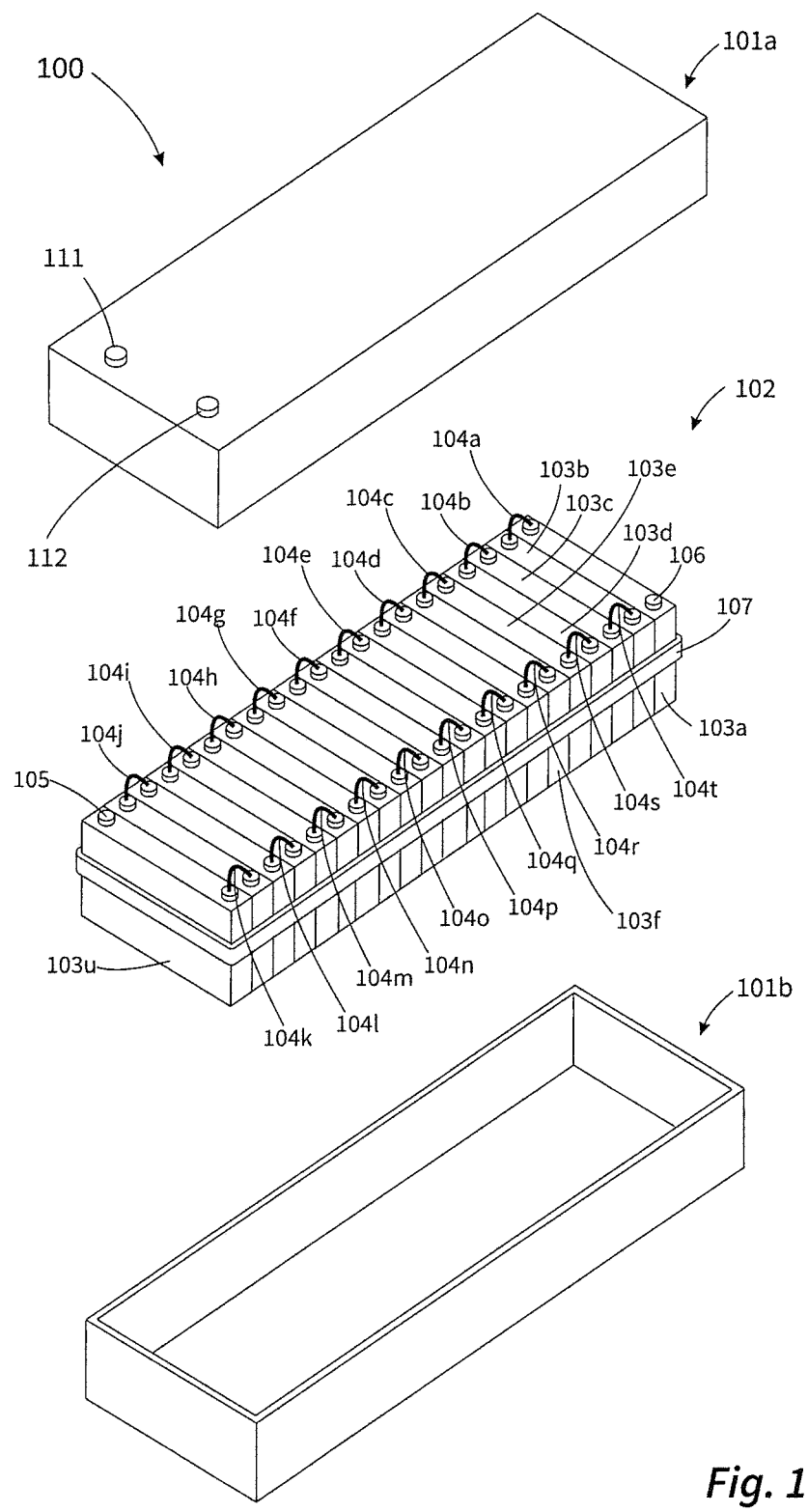
FIG. 1 schematically shows a possible construction of a battery including a two-part battery housing and a preferred example of a module assembly.

We provide a battery of modular construction comprising:
a battery housing surrounding an interior;
a module assembly comprising at least two battery modules, each with at least one positive and at least one negative electrode; and
a pressing means,
wherein
the module assembly is arranged in the interior of the battery housing,
the at least two battery modules electrically connect to one another,
the at least two battery modules are arranged next to one another in the module assembly,
optionally, a respective spacer element may be arranged between adjacent battery modules in the module assembly, and
the pressing means exerts a mechanical pressure onto the battery modules in the module assembly, the mechanical pressure pressing adjacent battery modules of the module assembly against one another or against the spacer element that may be arranged between them.

As a result of the pressure exerted by the pressing means, the adjacent battery modules are preferably respectively connected in a force-fitting manner directly to one another or to the spacer element that may be arranged between them by a two-dimensional contact region.

The battery housing is preferably closed. It can have one or more battery housing poles on its outer side, the battery housing poles being electrically connected to the electrodes of the at least two battery modules and it being possible for an electrical load to be connected to the battery housing poles. The battery housing can be composed both of metal, for example of aluminium, and also plastic. If the battery housing is composed of metal, it can have one or more pole bushings to keep the housing free of potential and, respectively, avoid a short circuit.

In principle, the battery modules can comprise electrochemical cells of any type. The battery modules particularly preferably comprise battery or capacitor cells or else a combination of battery and capacitor cells. The battery modules used can be both individual cells and also cell assemblies comprising a plurality of individual cells.

The simplest example of an individual cell is a cell comprising a positive and a negative electrode, that is to say cells with the sequence positive electrode/separator/negative electrode.

Furthermore, so-called bicells are considered to be individual cells, that is to say cells with the sequence
positive electrode/separator/negative electrode/separator/positive electrode
or
negative electrode/separator/positive electrode/separator/negative electrode.

The cell assembly used can be, for example, a stack comprising a plurality of individual cells with one of the specified sequences. If a cell or a cell assembly contains two or more electrodes of the same polarity, it is generally preferred that the electrodes electrically connect to one another via corresponding conductors, usually by welding.

Preferably, each of the battery modules has a dedicated module housing, in particular a housing composed of a film or foil, for example, a metal foil or a metal/plastic composite. Therefore, at least two battery modules, each in the dedicated module housing, are arranged in the battery housing in this case.

Furthermore, each of the battery modules generally has at least one positive connection pole routed through the module housing and at least one negative connection pole routed through the module housing. The at least one positive connection pole electrically connects to the positive electrodes within the module housing. The at least one negative connection pole electrically connects to the negative electrodes within the housing.

Preferably, the at least two battery modules comprise individual cells or cell assemblies based on lithium ions, that is to say cells in which lithium ions migrate from the positive electrode to the negative electrode and vice versa, during charging and discharging processes. The cells can be present, in particular, in the form of windings or in a stacked manner.

Particularly preferably, the at least two battery modules each comprise at least one cell based on C//NMC (carbon/nickel-manganese-cobalt) and/or based on C//LFP (carbon/lithium-iron phosphate).

The battery modules preferably comprise an electrolyte suitable for the cells comprised by it. In individual cells or cell assemblies based on lithium ions, the electrolyte is preferably an organic electrolyte, in particular based on organic carbonates, here.

The at least two battery modules preferably electrically connect to one another in series. However, basically the battery can also comprise battery modules connected in parallel.

Adjacent battery modules in the module assembly preferably electrically and mechanically connect to one another by at least one contact means. In this case, the at least one contact means preferably connects the connection poles of the adjacent battery modules. The contact means electrically and mechanically connects to each of the connection poles. The mechanical connection can be, for example, a weld connection, rivet connection, screw connection, solder connection or a clamping connection.

Preferred contact means particularly preferably have at least one of the following properties:
They are composed of a mechanically flexible electrically conductive material, for example, one or more pliable metal wires or a pliable metal foil or a pliable metal sheet.
They have two contact regions connected to connection poles of two adjacent battery modules.
The contact means have at least one bending, folding or torsion region, in which they are bent, folded or twisted, between the contact regions.
Overall, the contact means have a greater length than would be necessary to connect the connection poles.

The battery particularly preferably comprises 2 to 50 of the battery modules electrically connected to one another, particularly preferably 10 to 30 of the battery modules.

The battery modules preferably all have the same size and dimensions. The battery modules are particularly preferably of prismatic, in particular cuboidal, design. In this case, the module housing of the battery modules comprises a rectangular housing base, four side walls arranged at a right angle to the housing base, and also a housing upper part having substantially the same shape and size as the housing base. The housing base, the side walls and the housing upper part preferably exhibit little profiling. The outer surfaces of the housing base, side walls and housing upper part are particularly preferably planar or at least approximately planar.

The spacer element that may be arranged between the battery modules may be a thermally conductive element serving to discharge heat from the module assembly. To this end, the spacer element can be designed, for example, as a thermally conductive metal plate. However, the spacer element may also be a thermal insulating element intended to prevent heat being exchanged between adjacent battery modules in the module assembly.

The spacer element may be, for example, of plate-like design.

Suitable pressing means are, in particular, all devices or arrangements by way of which the desired mechanical pressure can be exerted onto the battery modules in the module assembly. Preferably, the pressing means is characterized by at least one of the following additional features:
The pressing means is or comprises at least one tensioning strap, in particular at least one elastically stretched tensioning strap surrounding the module assembly.
The pressing means is or comprises at least one tensioning frame surrounding the module assembly.
The pressing means comprises at least one tensioning spring.
The pressing means comprises at least one tie rod laid on and/or in the module assembly.

Therefore, the pressing means particularly preferably comprises or is a device under tensile stress. Therefore, the pressing means can comprise, for example, contact-pressure plates between which the module assembly is arranged and to which the at least one tensioning strap, the at least one tensioning spring or the at least one tie rod are fastened. The contact-pressure plates are drawn together by the at least one tensioning strap, the at least one tensioning spring or the at least one tie rod and, in this way, exert the desired mechanical pressure onto the battery modules in the module assembly.

Therefore, the pressing means is further preferably composed of an elastic material or preferably comprises one or more components composed of an elastic material.

Particularly preferably, the pressing means is
a tensioning strap composed of plastic or a composite material comprising plastic and a fiber material, which tensioning strap surrounds the module assembly, in particular an elastically stretched tensioning strap composed of plastic or composed of a composite material comprising plastic and a fiber material surrounding the module assembly.

However, for all intents and purposes, the tensioning strap can also be composed of other materials, for example, metal.

Preferably, the battery housing itself is the pressing means or part of the pressing means. It is possible to arrange the module assembly in the battery housing such that the mechanical pressure is exerted by the opposite walls of the battery housing. Therefore, the battery housing itself serves as a tensioning frame.

It is further possible that the module assembly rests against a wall of the battery housing and is pressed against this wall, for example, by a wedge, a spring or a compressed gas or a pressurized liquid. In these cases, both the wall against which the module assembly is pressed and also the auxiliary means required for this purpose, for example, the wedge, the spring or the compressed gas or the pressurized liquid, are constituent parts of the pressing means.

The individual battery modules are preferably in contact with one another or with spacer elements arranged between them by the side walls within the module assembly. Each of the battery modules preferably has two opposite outer sides arranged parallel to one another and by which the battery modules can be in contact with adjacent battery modules. Since the outer sides are generally flat, the contact region is very large. The contact region generally corresponds to the area of the outer sides or the side walls.

The battery is particularly distinguished in that it
has at least one safety means that triggers a reduction in the mechanical pressure, which is exerted onto the battery modules, when there is a defect in at least one of the battery modules.

The safety means preferably does not only trigger a reduction, but rather complete withdrawal of the mechanical pressure.

Owing to the reduction or withdrawal of the mechanical pressure, tension can be relieved in the module assembly. Adjacent cells are no longer necessarily in contact by the entire two-dimensional contact region. They are at least no longer pressed against one another by an external force. This results in a considerably reduced transfer of heat between adjacent battery modules. The propagation described at the outset is counteracted.

The solution is particularly efficient in the battery modules having a suitable module housing comprising a film or foil. The module housing can inflate when gas develops within the module housing. The outer sides of the film or foil housing are then no longer flat, but rather have a convex geometry. This change in shape counteracts the mechanical pressure exerted onto the battery modules. If the mechanical pressure is removed, adjacent battery modules can be pushed apart owing to the inflating housing. This necessarily reduces the size of the contact region between the battery module containing the inflated housing and the adjacent battery modules which are still intact. The transfer of heat from the defective battery module to the intact battery module also falls as a result.

Pushing apart the battery modules works particularly effectively when the battery comprises contact means having the at least one bending, folding or torsion region. A bending, folding or torsion region ensures that the battery modules are not held together by the contact means to make it impossible to push them apart. Instead, the bent, folded or twisted contact means can stretch in the battery modules being pushed apart so that the connection poles connected by the contact means can be moved away from one another. The contact means do not provide any resistance to the pushing-apart process.

Particularly preferably, the battery is distinguished by a sensor system by which parameters attributed to a defect can be recorded. These parameters include, in particular, forces exerted onto the pressing means, temperatures in the battery housing, in particular temperatures of individual battery modules, changes in the electrical voltage output by the battery or individual battery modules, and changes in the electric current output by the battery or individual battery modules.

Particularly preferably, the battery is accordingly distinguished by at least one of the following additional features:
  It comprises a force-measuring device with which a force directed against the mechanical pressure exerted by the pressing means can be detected.
  The force-measuring device is a constituent part of the module assembly or the pressing means.
  It comprises a temperature-measuring device, in particular comprising at least one temperature sensor that can detect a temperature in the battery housing and/or a temperature of individual battery modules of the module assembly.
  It comprises a voltage-measuring device that can detect a change in a voltage output by the module assembly, as a result of a defect in at least one of the battery modules of the module assembly.
  It comprises a current-measuring device that can detect a change in the current output by the module assembly, as a result of a defect in at least one of the battery modules of the module assembly.

In particular, the temperature-measuring device can also be a constituent part of one of the battery modules of the module assembly. A dedicated temperature-measuring device is preferably associated with each of the battery modules of the module assembly.

Preferably, the battery comprises a data-processing device coupled to the sensor system, in particular to the temperature-measuring device, or as a constituent part of the temperature-measuring device. Furthermore, the data-processing device can also be coupled to the force-measuring device, the voltage-measuring device and/or the current measuring device. The device or the devices is or are preferably coupled to the data-processing device such that they can transmit measurement results to the data-processing device, in particular including detected parameters which can be attributed to the defect.

The data-processing device is particularly preferably configured to be able to record changes in temperature in the battery housing on the individual battery module per unit time. An indicator of a defect in a battery module is, for example, a maximum temperature threshold value, for example a temperature of 80° C., being exceeded. However, furthermore, a reliable indicator of a defect can also be a very sharp increase in temperature within a very short period of time, for example, an increase in the temperature of a battery module by 20° C. over a maximum of 5 seconds.

The force-measuring device and/or the temperature-measuring device and/or the voltage-measuring device and/or the current-measuring device can connect to the at least one safety means so that a force detected by the force-measuring device and/or a change in temperature detected by the temperature-measuring device and/or a change in voltage detected by the voltage-measuring device and/or a change in the output current detected by the current-measuring device can trip the safety means. Therefore, it can be provided, for example, that the temperature threshold value at which the safety means is intended to be tripped is defined. Furthermore, it can be defined that, for example, an increase in temperature within a battery module by 20° C. over a period of <5 seconds is intended to trip the safety means.

The temperature-measuring device and/or the voltage-measuring device and/or the current-measuring device are particularly preferably connected to the at least one safety means via the data-processing device. The temperature-measuring device and/or the voltage-measuring device and/or the current-measuring device can record data, in particular the changes in voltage, temperature and current, and pass on the data to the data-processing device. The data-processing device can then trip the safety device when one or more defined parameters occur, for example, when a temperature threshold value is exceeded. To this end, a signal can be transmitted from the data-processing device to the safety means.

Preferably, the data-processing device is a constituent part of the battery. It is then preferably arranged in the interior of the battery housing.

The data-processing device may be associated only with the battery. The battery and the data-processing device are then parts of an energy storage system that can optionally also comprise more than one of the batteries. The data-processing device can then also, for example, perform the function of a battery management system associated with the battery or be part of such a management system.

It has already been described that battery modules with a dedicated module housing comprising a film or foil can be inflated when there is a defect. The inflation generally leads to a force which is directed against the mechanical pressure which is exerted by the pressing means. This can be recorded, for example, by the force-measuring device.

Further preferably, the battery is distinguished by at least one of the following features:
  The battery housing is closed in a liquid-tight and gas-tight manner.
  The battery housing surrounds an interior in which the module assembly is arranged, wherein the module assembly does not completely fill the interior, so that a dead volume remains.
  The dead volume occupies 1% to 10% of the interior.

The presence of the dead volume can be expedient to ensure that the module assembly can be relieved of tension when the at least one safety means is tripped. However, the safety means or constituent parts of the safety means can also be arranged in the dead volume.

Further preferably, the battery is distinguished by at least one of the following additional features:
  The safety means is designed to deactivate or destroy the pressing element or a constituent part of the pressing element for the purpose of reducing the mechanical pressure. The safety means is designed to create a pressure directed opposite to the mechanical pressure that presses the battery modules against one another in the module assembly. Depending on the design of the pressing means, there are respectively numerous ways of destroying or deactivating the pressing means.

It is possible to arrange a means for destroying or deactivating the pressing means within the battery housing, in particular using the dead volume, as a constituent part of the safety means, the means destroying or deactivating the pressing means in a defect in at least one of the battery modules. To this end, the battery can have, as a further constituent part of the safety means, an actuator that can optionally likewise be arranged in the dead volume. The actuator can be coupled to the data-processing device and initiate the destruction or deactivation of the pressing means in response to a signal from the data-processing device. Therefore, the data-processing device can also be assigned a control function.

If the pressing means is the tensioning strap, the means for destroying the pressing means may be, for example, a cutting tool. A sharp edge of the cutting tool can be pressed against the tensioning strap to sever the tensioning strap in response to a signal from the data-processing device.

The tensioning strap can be destroyed using a material exhibiting overproportional expansion when there is an increase in temperature within the battery housing. A material of this type can expand to a great extent as a result of heating within the battery housing and exert a mechanical force onto a means for destroying the pressing means, for example, with the cutting tool. An actuator which is controlled by the data-processing device is not required here.

When, as described above, the module assembly bears against a wall of the battery housing and pressed against this wall, for example, by means one of the mentioned auxiliary means, the auxiliary means can be destroyed or deactivated with the aid of the actuator. Therefore, it can be provided, for example, that a container in which the abovementioned pressurized fluid is arranged is destroyed with the aid of the actuator.

Particularly preferably, the battery comprises, as safety means, an elastically stretched tensioning strap entirely or partially composed of a material that loses its elastic properties and/or tears in the event of heating over a temperature threshold value so that the desired reduction in mechanical pressure results.

Therefore, the safety means can also consist of a particular design of the pressing means or a constituent part of the pressing means, that is to say of the tensioning strap, for example.

In particular, when the pressing means is a tensioning strap composed of metal or plastic or of a plastic-based material, for example, a composite material comprising plastic and a fiber material, which tensioning strap surrounds the module assembly, the safety means can also be a means for thermally destroying the tensioning strap, for example a means for destroying the tensioning strap by melting the material from which the tensioning strap is composed.

Particularly preferably, the safety means can comprise a heating element for thermally destroying the pressing means, which heating element is designed to generate heat leading to the material from which the pressing means is composed melting or being destroyed. To this end, the heating element can have, for example, a heating wire or a heatable blade.

The heating element is preferably in direct contact with the pressing means, in particular with the tensioning strap so that the heating element can output the heat directly to the pressing means or can transfer the heat directly to the pressing means.

Particularly preferably, this heating element is fed with electrical energy from the battery of modular construction. To this end, the heating element can be electrically coupled to connection poles of one or more battery modules of the module assembly. However, in principle, it is also possible to connect the heating element to an external energy source. However, it is preferred that the heating element is fed with electrical energy from the battery of modular construction since, in this case, only electrical contact-connection is required within the housing.

The heating element can be controlled by the data-processing device. A switching apparatus is preferably associated with the heating element, it being possible for the heating element to be activated by the switching apparatus. The switching apparatus may be coupled to the data-processing device and can be switched by the data-processing device. The switching apparatus can be a separate component, in particular within the battery housing, or it can be a constituent part of the heating element.

The mechanical pressure exerted onto the battery module is therefore preferably reduced by the pressing means being destroyed or deactivated. In this example, the mechanical pressure which is exerted onto the battery modules is not only lowered, but rather reduced to zero.

In particular, when the battery housing itself serves as a tensioning frame, the safety means is preferably designed to destroy the housing or open the housing without destroying it. Therefore, the battery housing can comprise, as safety means or as a constituent part of a safety means, one or more detonating cords with which the housing is destroyed at defined points for the purpose of reducing the mechanical pressure. For example, one or more detonating cords can be positioned in the edge region of one of the walls of the battery housing so that the wall can be separated from the battery housing by tripping detonation when there is a defect in a battery module.

The housing can additionally be provided with predetermined breaking points, for example, at the edge regions.

We also provide a method for safe operation of a battery having the above features. The method is distinguished in that the battery is equipped with the described at least one safety means that triggers a reduction in the mechanical pressure exerted onto the battery modules when there is a defect in at least one of the battery modules.

Further features, details and advantages can be gathered from the appended claims and the abstract, the wording of the claims and abstract being incorporated in the description by reference, from the following description of preferred examples and also on the basis of the drawings.

The battery 100 illustrated in FIG. 1 consists of a two-part battery housing 101a, 101b and a module assembly 102 arranged in the battery housing and comprises a large number of battery modules 103a to 103u of identical design. The two constituent parts 101a and 101b of the battery housing and the module assembly 102 of the battery 100 are illustrated individually for the purpose of better clarity.

The battery modules 103a to 103u are combined by the tensioning strap 107 that serves as pressing means, to form the module assembly 102. The tensioning strap 107 is under tension. The tensioning strap exerts a mechanical pressure onto the battery modules 103a to 103u, the mechanical pressure pressing the battery modules 103a to 103u against one another. The tensioning strap 107 is an elastically stretched tensioning strap that loses its elastic properties when it is heated above a temperature threshold value of 80° C. so that the mechanical pressure exerted by the tensioning strap falls. If the temperature threshold value is exceeded and a force opposing the mechanical pressure is exerted by the tensioning strap additionally acts on the strap, the tensioning strap can even tear.

The battery housing part 101a comprises the external battery housing poles 111 and 112. The external battery housing poles electrically connect to the electrodes of the battery modules 103a to 103u by the connection poles 105 and 106. The individual battery modules 103a to 103u connect with one another in series by the contact means 104 to 104t. The contact means are metal wires of which the ends are respectively fixed to the connection poles to be connected. Between the end contact regions, the contact means each have a bending region in which they are bent. Therefore, overall, the contact means have a greater length than would be necessary to connect the connection poles.

The construction of the battery modules 103a to 103u can be illustrated with reference to FIG. 3 in which the battery module 103f is shown by way of example. The battery module 103f is of cuboidal design and has a module housing composed of a film or foil. The module housing of the battery module 103f comprises a rectangular housing base (not visible), four side walls arranged at a right angle to the rectangular housing base (the side walls 108 and 109 are visible), and also a housing upper part 110. The side walls which are not shown here correspond in size and shape to the side walls 108 and 109 (the side wall 115 parallel to the side wall 108 is shown in a deformed manner in FIG. 2). The same applies to the housing base which, apart from two bushings for the external connection poles 113 and 114, has the same shape and size as the housing upper part 110. The outer sides of the housing base, of the side walls 108 and 109 and of the housing upper part 110 are planar or at least approximately planar.

The individual battery modules 103a to 103u are in contact with one another by way of the side walls within the module assembly 102 shown in FIG. 1. The side walls lie flat against one another. This results in a two-dimensional contact region between adjacent battery modules within the stack, for example, between the battery modules 103e and 103f, the size of the said two-dimensional contact region corresponding to the area of the side walls by which the battery modules are in contact with one another.

Figure 2:
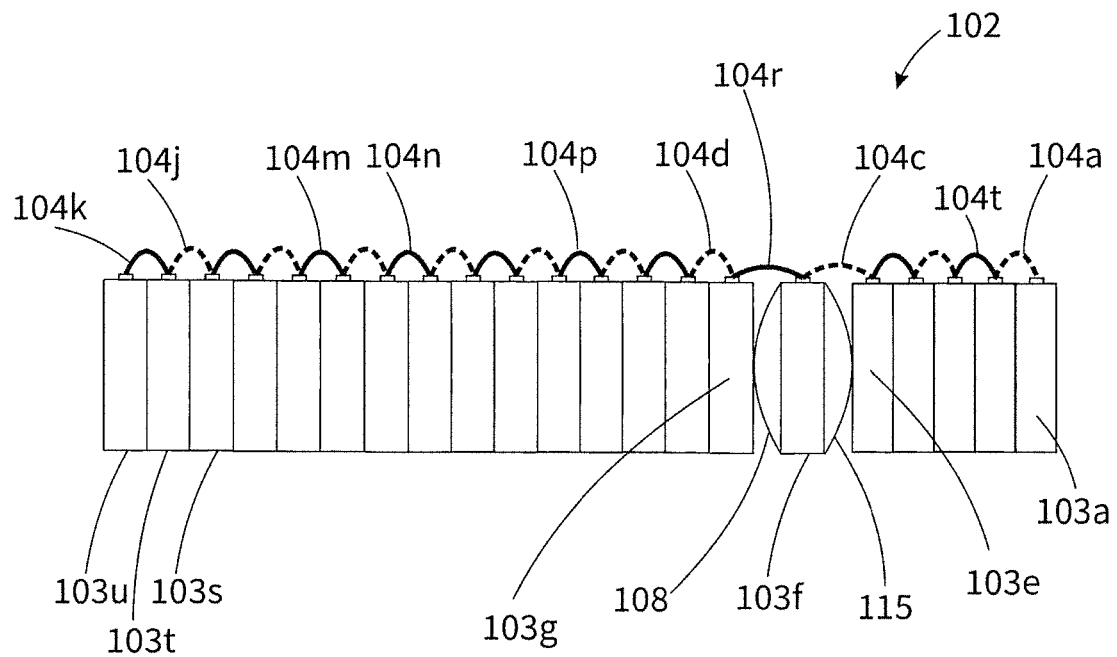
FIG. 2 schematically shows the behavior of the module assembly of the battery illustrated in FIG. 1 in a battery module having a defect.
Figure 3:
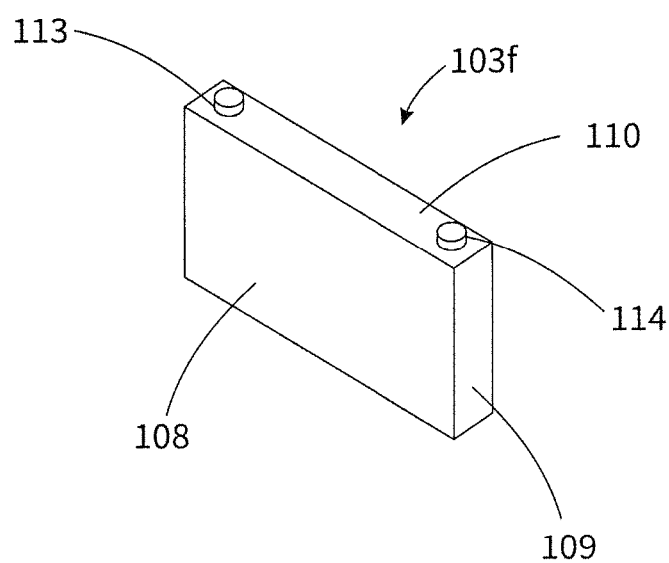
FIG. 3 schematically shows the constructions of an individual battery module which is a constituent part of the module assembly illustrated in FIG. 2.

The battery module 103f shown in FIG. 3 is shown in the case of a defect in FIG. 2. An internal short circuit resulted in an increase in temperature and inflation of the side walls 108 and 115 of the battery module 103f. The resulting action of force on the tensioning strap 107 or a means for destroying or deactivating the tensioning strap 107, which means was tripped as a result of the increase in temperature, led to the tensioning strap 107 tearing. As a result of the removal of the tensioning strap 107, the battery modules 103a to 103u are still connected to one another only by the contact means 104a to 104t. Here, the contact means 104k to 104t facing the viewer are illustrated by solid lines, and the contact means 104a to 104j situated further behind are illustrated using dashed lines.

The segments of the module assembly 102 made up of the battery modules 103a-103e and of the battery modules 103g-103u can be pushed apart without resistance by the inflating housing of the battery module 103f as a result of the removal of the tensioning strap. The contact means 104c and 104r are long enough to permit this. The battery housing comprising the parts 101a and 101b has a sufficient length for this purpose. As a result, the contact region between the defective battery module 103f and the adjacent battery modules 103e and 103g, which are still intact, is reduced in size. Furthermore, the transfer of heat from the defective battery module 103f to the intact battery modules 103e and 103g also falls as a result.

Figure 4:
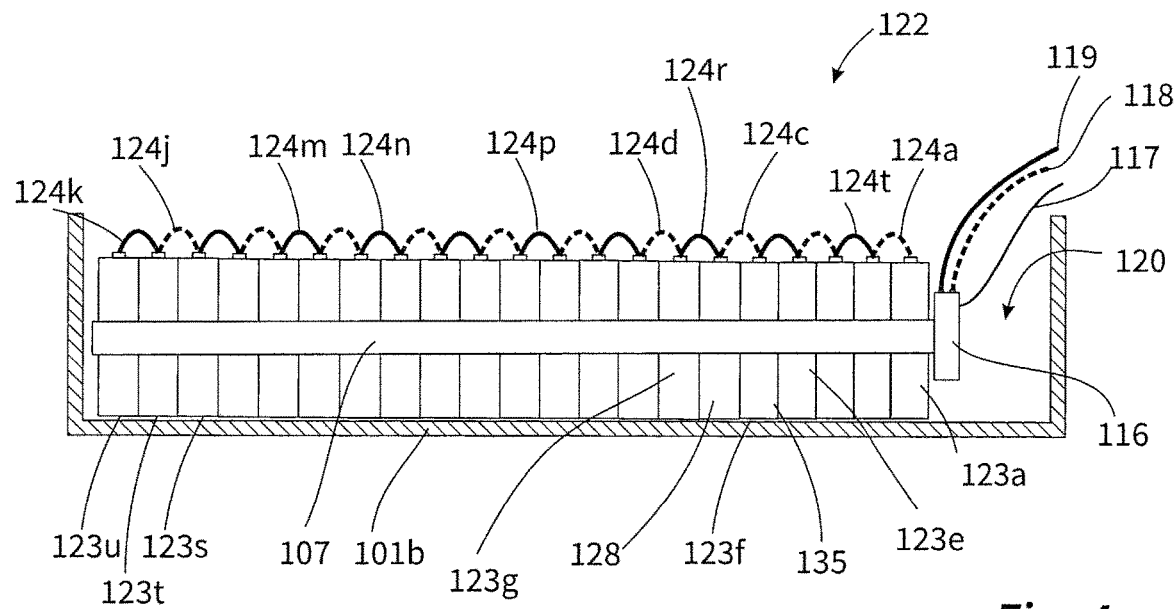
FIGS. 4 and 5 schematically show the arrangement of the module assembly illustrated in FIG. 1 in a part of the battery housing illustrated in FIG. 1 (illustration of a longitudinal section).
Figure 5:
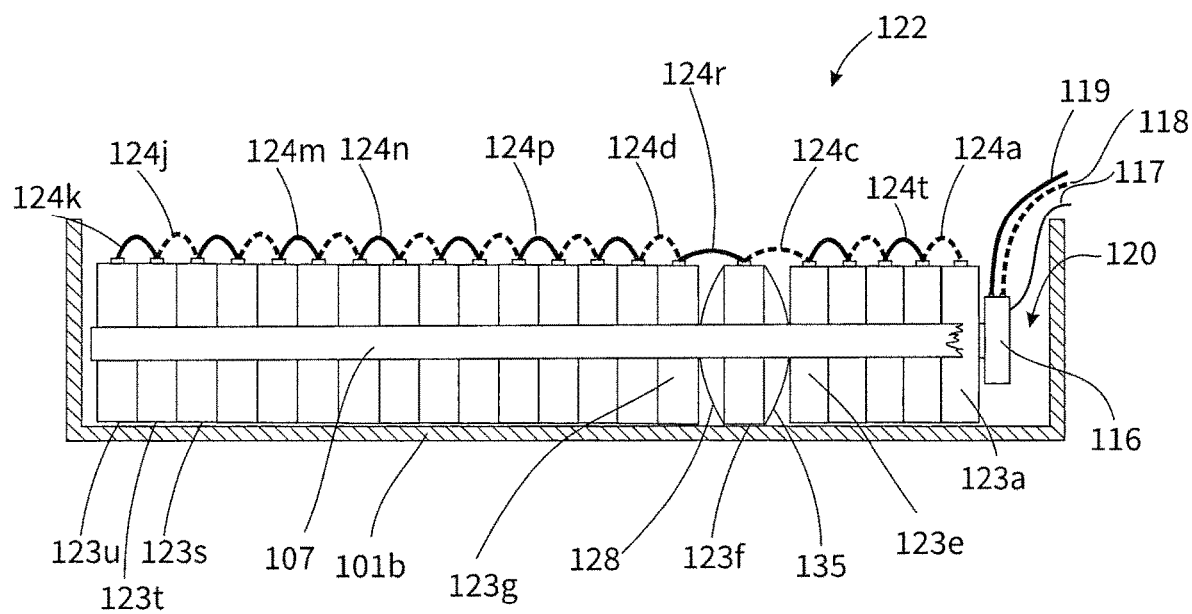

FIGS. 4 and 5 illustrate the manner of operation of the safety means. The figures each show a longitudinal section through the battery housing part 101b, shown in FIG. 1, in which the module assembly 102 is arranged. For the sake of clarity, the battery housing is shown in an open manner, that is to say without the battery housing part 101a.

It can be clearly seen that the module assembly 102 does not completely fill the housing. A dead volume 120 remains, in which the module assembly can expand if required and in which further components of the battery can be arranged. In this case, the heating element 116 is arranged in the dead volume 120, the heating element being in contact with the tensioning strap 107 and serving as means for destroying and/or deactivating the pressing means, that is to say the tensioning strap 107.

The heating element 116 preferably draws the energy required for its operation from the module assembly 102. To this end, the heating element can be coupled, for example, to the poles 105 and 106 via the electrical lines 118 and 119. For reasons of clarity, the electrical lines are only partially illustrated. The heating element 116 can be coupled to a data-processing device, by which it is activated in the case of a defect, via the line 117.

Whereas FIG. 4 illustrates the situation during normal operation, that is to say without a defect, FIG. 5 shows the defective case. In the FIG. 5, the tensioning belt 107 has been destroyed by the heating element 116 by heating. As a result, the side walls 128 and 135 of the defective battery module 123f were able to inflate without a great deal of resistance and the module was able to expand into the dead volume 120.

Figure 6:
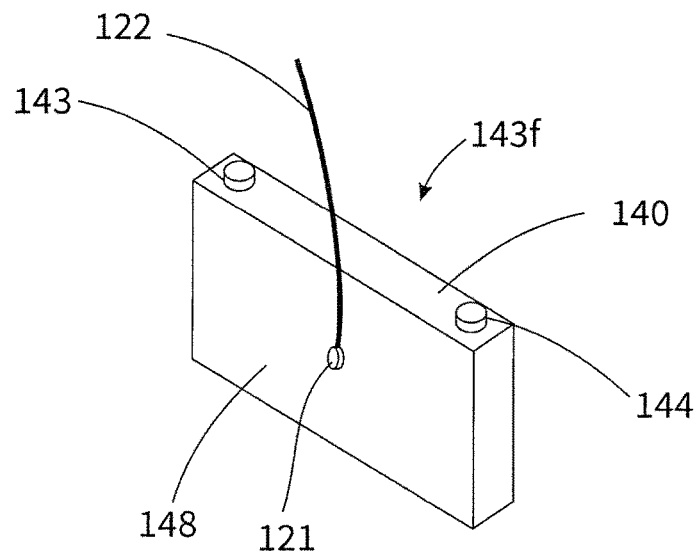
FIG. 6 schematically shows the construction of a further individual battery module that can be a constituent part of the module assembly of a battery.

The battery module shown in FIG. 6 differs from that illustrated in FIG. 3 only in that it has, as a temperature-measuring device that can detect the temperature of the battery module, the temperature sensor 121. The temperature sensor can transmit the measured temperature to a data-processing device via the cable 122.

Figure 7:
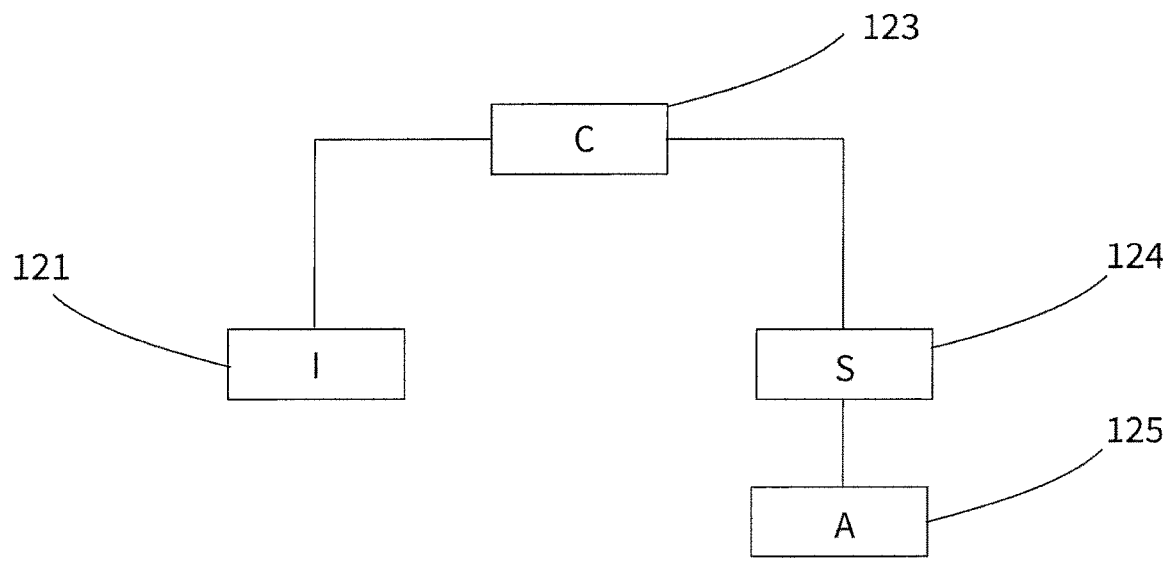
FIG. 7 schematically shows coupling of a data-processing device to a sensor system and a means for destroying the pressing means.

A temperature sensor 121 as illustrated in FIG. 6 can be coupled to a data-processing device 123, for example, in accordance with the diagram shown in FIG. 7. The data-processing device is further coupled to a switch 124 and can activate the heating element 116 by the switch. The heating element 116 is, in particular, that heating element illustrated in FIGS. 4 and 5.

Although the apparatus and methods have been described in connection with specific forms thereof, it will be appreciated that a wide variety of equivalents may be substituted for the specified elements described herein without departing from the spirit and scope of this disclosure as described in the appended claims.

The invention claimed is:

1. A battery of modular construction that stores electrical energy comprising:
   1) a battery housing,
   2) a module assembly comprising at least two battery modules, each with at least one positive and at least one negative electrode,
   3) a pressing means,
   wherein
      the battery housing surrounds an interior in which the module assembly is arranged, and the module assembly does not completely fill the interior so that a dead volume remains, the at least two battery modules electrically connect to one another, the at least two battery modules are arranged next to one another in the module assembly, optionally, a respective spacer element is arranged between adjacent battery modules in the module assembly, and the pressing means exerts a mechanical pressure onto the battery modules in the module assembly, the mechanical pressure pressing adjacent battery modules of the module assembly against one another or against the spacer element which may be arranged between them, 4) a force-measuring device with which a force directed against the mechanical pressure exerted by the pressing means can be detected, and/or a temperature-measuring device that can detect a temperature in the battery housing and/or a temperature of individual battery modules of the module assembly, and/or a voltage-measuring device that can detect a change in a voltage, output by a module assembly as a result of a defect in at least one of the battery modules of the module assembly, and/or a current-measuring device that can detect a change in the current output by the module assembly as a result of a defect in at least one of the battery modules of the module assembly, wherein the device or the devices is or are coupled to a data-processing device to which measurement results from the device or from the devices are transmitted, the battery has at least one safety means in the interior of the battery housing, the safety means triggering a reduction in the mechanical pressure exerted onto the battery modules when there is a defect in at least one of the battery modules, the safety means is or comprises a means for destroying and/or deactivating the pressing means, the means destroying or deactivating the pressing means in the presence of a defect, the destroying and/or deactivation means is coupled to the data-processing device and initiates destruction or deactivation of the pressing means in response to a signal from the data-processing device, the data processing unit is configured to a) receive a force and/or a temperature and/or a voltage and/or a current value from the force-measuring device and/or the temperature-measuring device and/or the voltage-measuring device and/or the current-measuring device, b) compare the received value(s) with a stored, predefined threshold value, an exceeding of which indicates a defect in at least one of the battery modules, and c) trigger the safety device if the threshold value is exceeded, and the safety means destroys and thus irreversibly deactivates the pressing means.

2. The battery according to claim 1, wherein the data-processing device is a constituent part of the battery.

3. The battery according to claim 1, further comprising at least one of:

a force-measuring device with which a force directed against the mechanical pressure exerted by the pressing means can be detected, the force-measuring device is a constituent part of the module assembly or of the pressing means, a temperature-measuring device that can detect a change in the temperature in the battery housing and/or a change in the temperature of individual battery modules of the module assembly, a voltage-measuring device that can detect a change in a voltage output by the module assembly as a result of a defect in at least one of the battery modules of the module assembly, and a current-measuring device that can detect a change in the current output by the module assembly, as a result of a defect in at least one of the battery modules of the module assembly.

4. The battery according to claim 1, wherein at least one of:

the battery housing is closed in a liquid-tight and gas-tight manner, or the dead volume occupies 1% to 10% of the interior.

5. The battery according to claim 1, wherein at least one of:

the safety means is designed to deactivate or destroy the pressing means or a constituent part of the pressing means to reduce the mechanical pressure, or the safety means creates a pressure directed opposite to the mechanical pressure which presses the battery modules against one another in the module assembly.

6. A method of safety operation of the battery according to claim 1, comprising equipping the battery with at least one safety means that triggers a reduction in the mechanical pressure exerted onto the battery modules when there is a defect in at least one of the battery modules.

7. The battery according to claim 1, wherein the pressing means is or comprises at least one tensioning frame surrounding the module assembly.

8. A battery of modular construction that stores electrical energy comprising:

1) a battery housing,
2) a module assembly comprising at least two battery modules, each with at least one positive and at least one negative electrode,
3) a pressing means, wherein the battery housing surrounds an interior in which the module assembly is arranged, and the module assembly does not completely fill the interior so that a dead volume remains, the at least two battery modules electrically connect to one another, the at least two battery modules are arranged next to one another in the module assembly, optionally, a respective spacer element is arranged between adjacent battery modules in the module assembly, and the pressing means exerts a mechanical pressure onto the battery modules in the module assembly, the mechanical pressure pressing adjacent battery modules of the module assembly against one another or against the spacer element which may be arranged between them, 4) a force-measuring device with which a force directed against the mechanical pressure exerted by the pressing means can be detected, and/or a temperature-measuring device that can detect a temperature in the battery housing and/or a temperature of individual battery modules of the module assembly, and/or a voltage-measuring device that can detect a change in a voltage, output by a module assembly as a result of a defect in at least one of the battery modules of the module assembly, and/or a current-measuring device that can detect a change in the current output by the module assembly as a result of a defect in at least one of the battery modules of the module assembly, wherein the device or the devices is or are coupled to a data-processing device to which measurement results from the device or from the devices are transmitted, the battery has at least one safety means in the interior of the battery housing, the safety means triggering a reduction in the mechanical pressure exerted onto the battery modules when there is a defect in at least one of the battery modules, the safety means is or comprises a means for destroying and/or deactivating the pressing means, the means destroying or deactivating the pressing means in the presence of a defect, the destroying and/or deactivation means is coupled to the data-processing device and initiates destruction or deactivation of the pressing means in response to a signal from the data-processing device, the data processing unit is configured to a) receive a force and/or a temperature and/or a voltage and/or a current value from the force-measuring device and/or the temperature-measuring device and/or the voltage-measuring device and/or the current-measuring device, b) compare the received value(s) with a stored, predefined threshold value, an exceeding of which indicates a defect in at least one of the battery modules, and c) trigger the safety device if the threshold value is exceeded, and the pressing means is or comprises at least one elastically stretched tensioning strap surrounding the module assembly.

9. The battery according to claim 8, wherein the tensioning strap is an elastically stretched tensioning strap composed of plastic or composed of a composite material comprising plastic and a fiber material.

10. A battery of modular construction that stores electrical energy comprising:
1) a battery housing,
2) a module assembly comprising at least two battery modules, each with at least one positive and at least one negative electrode,
3) a pressing means,
wherein
the battery housing surrounds an interior in which the module assembly is arranged, and the module assembly does not completely fill the interior so that a dead volume remains,
the at least two battery modules electrically connect to one another,
the at least two battery modules are arranged next to one another in the module assembly,
optionally, a respective spacer element is arranged between adjacent battery modules in the module assembly, and
the pressing means exerts a mechanical pressure onto the battery modules in the module assembly, the mechanical pressure pressing adjacent battery modules of the module assembly against one another or against the spacer element which may be arranged between them,
4) a force-measuring device with which a force directed against the mechanical pressure exerted by the pressing means can be detected, and/or
a temperature-measuring device that can detect a temperature in the battery housing and/or a temperature of individual battery modules of the module assembly, and/or
a voltage-measuring device that can detect a change in a voltage, output by a module assembly as a result of a defect in at least one of the battery modules of the module assembly, and/or
a current-measuring device that can detect a change in the current output by the module assembly as a result of a defect in at least one of the battery modules of the module assembly, wherein the device or the devices is or are coupled to a data-processing device to which measurement results from the device or from the devices are transmitted, the battery has at least one safety means in the interior of the battery housing, the safety means triggering a reduction in the mechanical pressure exerted onto the battery modules when there is a defect in at least one of the battery modules, the safety means is or comprises a means for destroying and/or deactivating the pressing means, the means destroying or deactivating the pressing means in the presence of a defect, the destroying and/or deactivation means is coupled to the data-processing device and initiates destruction or deactivation of the pressing means in response to a signal from the data-processing device, the data processing unit is configured to a) receive a force and/or a temperature and/or a voltage and/or a current value from the force-measuring device and/or the temperature-measuring device and/or the voltage-measuring device and/or the current-measuring device, b) compare the received value(s) with a stored, predefined threshold value, an exceeding of which indicates a defect in at least one of the battery modules, and c) trigger the safety device if the threshold value is exceeded, and the pressing means comprises at least one tensioning spring.

11. A battery of modular construction that stores electrical energy comprising:
1) a battery housing,
2) a module assembly comprising at least two battery modules, each with at least one positive and at least one negative electrode,
3) a pressing means,
wherein
the battery housing surrounds an interior in which the module assembly is arranged, and the module assembly does not completely fill the interior so that a dead volume remains,
the at least two battery modules electrically connect to one another,
the at least two battery modules are arranged next to one another in the module assembly,
optionally, a respective spacer element is arranged between adjacent battery modules in the module assembly, and
the pressing means exerts a mechanical pressure onto the battery modules in the module assembly, the mechanical pressure pressing adjacent battery modules of the module assembly against one another or against the spacer element which may be arranged between them,
4) a force-measuring device with which a force directed against the mechanical pressure exerted by the pressing means can be detected, and/or a temperature-measuring device that can detect a temperature in the battery housing and/or a temperature of individual battery modules of the module assembly, and/or a voltage-measuring device that can detect a change in a voltage, output by a module assembly as a result of a defect in at least one of the battery modules of the module assembly, and/or a current-measuring device that can detect a change in the current output by the module assembly as a result of a defect in at least one of the battery modules of the module assembly, wherein the device or the devices is or are coupled to a data-processing device to which measurement results from the device or from the devices are transmitted, the battery has at least one safety means in the interior of the battery housing, the safety means triggering a reduction in the mechanical pressure exerted onto the battery modules when there is a defect in at least one of the battery modules, the safety means is or comprises a means for destroying and/or deactivating the pressing means, the means destroying or deactivating the pressing means in the presence of a defect, the destroying and/or deactivation means is coupled to the data-processing device and initiates destruction or deactivation of the pressing means in response to a signal from the data-processing device, the data processing unit is configured to a) receive a force and/or a temperature and/or a voltage and/or a current value from the force-measuring device and/or the temperature-measuring device and/or the voltage-measuring device and/or the current-measuring device, b) compare the received value(s) with a stored, predefined threshold value, an exceeding of which indicates a defect in at least one of the battery modules, and c) trigger the safety device if the threshold value is exceeded, and the pressing means comprises at least one tie rod which is laid on and/or in the module assembly.

* * * * *